(12) United States Patent
Aspar et al.

(10) Patent No.: US 7,615,463 B2
(45) Date of Patent: Nov. 10, 2009

(54) METHOD FOR MAKING THIN LAYERS CONTAINING MICROCOMPONENTS

(75) Inventors: Bernard Aspar, Rives (FR); Christelle Lagahe, Saint Joseph de Riviere (FR); Bruno Ghyselen, Fontaine (FR)

(73) Assignees: Commissariat a l'Energie Atomique, Paris (FR); S.O.I. Tec Silicon On Insulator Technologies, Paris (FR)

( * ) Notice: Subject to any disclaimer, the term of this patent is extended or adjusted under 35 U.S.C. 154(b) by 0 days.

(21) Appl. No.: 10/492,343

(22) PCT Filed: Oct. 8, 2002

(86) PCT No.: PCT/FR02/03422

§ 371 (c)(1),
(2), (4) Date: Feb. 14, 2005

(87) PCT Pub. No.: WO03/032384

PCT Pub. Date: Apr. 17, 2003

(65) Prior Publication Data

US 2005/0221583 A1     Oct. 6, 2005

(30) Foreign Application Priority Data

Oct. 11, 2001   (FR) ................... 01 13105

(51) Int. Cl.
*H01L 21/30* (2006.01)
*H01L 21/46* (2006.01)
(52) U.S. Cl. ................. 438/458; 257/E21.568
(58) Field of Classification Search ................. 438/455, 438/458, 459, E21.568
See application file for complete search history.

(56) References Cited

U.S. PATENT DOCUMENTS 4,028,149 A    6/1977   Deines et al.

(Continued)

FOREIGN PATENT DOCUMENTS

EP        0 410 679 A1    1/1991

(Continued)

OTHER PUBLICATIONS

H. Moriceau et al. Cleaning and Polishing As Key Steps For Smart-Cut SOI Process, Proceedings 1996 IEEE SOI Conference, Oct. 1996.*

(Continued)

*Primary Examiner*—Michelle Estrada
*Assistant Examiner*—Jarrett J Stark
(74) *Attorney, Agent, or Firm*—Brinks Hofer Gilson & Lione

(57) ABSTRACT

The invention concerns a method for making thin layers containing microcomponents using a substrate. The method includes the following steps: a) provides a substrate; b) local implantation of at least a gaseous species in said substrate perpendicular to a plurality of implantation zones defined on the surface of the substrate, avoiding, by adequate selection of the depth and the shape of said implantation zones, degradation of said surface of the substrate during the step c); c) producing microcomponents in the surface layer of the substrate delimited by the implanting depth; and d) separating the substrate in two parts, one part containing the surface layer including said microcomponents, and the other the rest of the substrate. The invention is useful for producing microcomponents to be integrate on supports different from the those used for their manufacture.

17 Claims, 3 Drawing Sheets

U.S. PATENT DOCUMENTS

| | | | |
|---|---|---|---|
| 4,254,590 | A | 3/1981 | Eisele et al. |
| 5,242,863 | A | 9/1993 | Xiang-Zheng et al. |
| 5,300,788 | A | 4/1994 | Fan et al. |
| 5,374,564 | A * | 12/1994 | Bruel .................. 438/455 |
| 5,400,458 | A | 3/1995 | Rambosek |
| 5,405,802 | A | 4/1995 | Yamagata et al. |
| 5,559,043 | A | 9/1996 | Bruel |
| 5,811,348 | A | 9/1998 | Matsushita et al. |
| 5,854,123 | A | 12/1998 | Sato et al. |
| 5,909,627 | A | 6/1999 | Egloff |
| 5,920,764 | A | 7/1999 | Hanson et al. |
| 5,953,622 | A * | 9/1999 | Lee et al. .................. 438/458 |
| 5,966,620 | A | 10/1999 | Sakaguchi et al. |
| 5,993,677 | A | 11/1999 | Biasse et al. |
| 5,994,207 | A | 11/1999 | Henley et al. |
| 6,013,563 | A | 1/2000 | Henley et al. |
| 6,020,252 | A | 2/2000 | Aspar |
| 6,048,411 | A | 4/2000 | Henley |
| 6,054,370 | A * | 4/2000 | Doyle .................. 438/456 |
| 6,071,795 | A | 6/2000 | Cheung et al. |
| 6,103,597 | A | 8/2000 | Aspar et al. |
| 6,103,599 | A | 8/2000 | Henley et al. |
| 6,127,199 | A | 10/2000 | Inoue |
| 6,127,244 | A * | 10/2000 | Lee .................. 438/458 |
| 6,146,979 | A | 11/2000 | Henley et al. |
| 6,150,239 | A | 11/2000 | Goesele et al. |
| 6,190,998 | B1 | 2/2001 | Bruel et al. |
| 6,225,190 | B1 | 5/2001 | Bruel et al. |
| 6,225,192 | B1 | 5/2001 | Aspar et al. |
| 6,271,101 | B1 | 8/2001 | Fukunaga |
| 6,303,468 | B1 | 10/2001 | Aspar et al. |
| 6,323,108 | B1 | 11/2001 | Kub et al. |
| 6,323,109 | B1 | 11/2001 | Okonogi |
| 6,346,458 | B1 | 2/2002 | Bower |
| 6,362,077 | B1 | 3/2002 | Aspar et al. |
| 6,513,564 | B2 | 2/2003 | Bryan et al. |
| 6,534,380 | B1 | 3/2003 | Yamauchi et al. |
| 6,593,212 | B1 | 7/2003 | Kub et al. |
| 6,607,969 | B1 | 8/2003 | Kub et al. |
| 6,727,549 | B1 * | 4/2004 | Doyle .................. 257/347 |
| 6,756,286 | B1 | 6/2004 | Moriceau et al. |
| 6,770,507 | B2 | 8/2004 | Abe et al. |
| 6,946,365 | B2 | 9/2005 | Aspar et al. |
| 2002/0025604 | A1 | 2/2002 | Tiwari |
| 2002/0153563 | A1 | 10/2002 | Ogura |
| 2002/0185684 | A1 * | 12/2002 | Campbell et al. .......... 257/347 |
| 2003/0077885 | A1 | 4/2003 | Aspar et al. |
| 2003/0134489 | A1 | 7/2003 | Schwarzenbach et al. |
| 2003/0162367 | A1 | 8/2003 | Roche |
| 2003/0199105 | A1 | 10/2003 | Kub et al. |
| 2004/0144487 | A1 | 7/2004 | Martinez et al. |

FOREIGN PATENT DOCUMENTS

| | | |
|---|---|---|
| EP | 0 293 049 B1 | 9/1993 |
| EP | 0 793 263 A2 | 9/1997 |
| EP | 0 801 419 A1 | 10/1997 |
| EP | 0 807 970 A1 | 11/1997 |
| EP | 0 917 193 A1 | 5/1999 |
| EP | 0 938 129 A1 | 8/1999 |
| EP | 0 533 551 B1 | 3/2000 |
| EP | 0 902 843 B1 | 3/2000 |
| EP | 0 994 503 A1 | 4/2000 |
| EP | 1 050 901 A2 | 11/2000 |
| EP | 0 717 437 B1 | 4/2002 |
| EP | 0 786 801 A1 | 6/2003 |
| EP | 0 767 486 B1 | 1/2004 |
| EP | 0 925 888 B1 | 11/2004 |
| EP | 1 014 452 B1 | 5/2006 |
| FR | 2 681 472 A1 | 3/1993 |
| FR | 2 748 851 A1 | 5/1996 |
| FR | 2 758 907 A1 | 1/1997 |
| FR | 2 748 850 A1 | 11/1997 |
| FR | 27 81 925 A1 | 7/1998 |
| FR | 2 767 416 A1 | 2/1999 |
| FR | 2 773 261 | 7/1999 |
| FR | 2 774 510 A1 | 8/1999 |
| FR | 2 796 491 | 1/2001 |
| FR | 2 797 347 | 2/2001 |
| FR | 2 809 867 | 7/2001 |
| FR | 2 847 075 A1 | 5/2004 |
| JP | 62265717 | 11/1987 |
| JP | 101004013 | 1/1989 |
| JP | 07-254690 | 10/1995 |
| JP | 7-302889 | 11/1995 |
| JP | 09-213594 | 8/1997 |
| JP | 09-307719 | 11/1997 |
| JP | 11045862 | 2/1999 |
| JP | 11-87668 | 3/1999 |
| JP | 11074208 | 3/1999 |
| JP | 11-145436 | 5/1999 |
| JP | 11-233449 | 8/1999 |
| WO | 99/08316 | 2/1999 |
| WO | WO 99/35674 A1 | 7/1999 |
| WO | WO 99/39378 | 8/1999 |
| WO | WO 00/48238 | 8/2000 |
| WO | WO 00/63965 | 10/2000 |
| WO | WO 01/11930 A2 | 2/2001 |
| WO | WO 02/47156 A1 | 6/2002 |
| WO | WO 02/083387 A1 | 10/2002 |
| WO | WO 03/013815 | 2/2003 |
| WO | WO 2004/044976 | 5/2004 |

OTHER PUBLICATIONS

M. Bruel, Silicon on insulator material technology, Electronics Letters Jul. 6, 1995 vol. 31 No. 14 pp. 1201-1202.*

"Transfer of Patterned Ion-Cut Silicon Layers", C. H. Yun et al., Applied Physics Letters, V.73, No. 19, pp. 2772-2774, 1998.*

Bruel et al, ".RTM."Smart Cut": A Promising New SOI Material Technology", Proceedings 1995 IEEE International SOI Conference, Oct. 1995, pp. 178-179.*

Aspar et al, "Transfer of structured and patterned thin silicon films using the Smart-Cut.RTM. process", Electronics Letters, vol. 32, No. 21, Oct. 10, 1996, pp. 1985-1986.*

Yun, C. H. and Cheung, N. W. 2001. Thermal and mechanical separations of silicon layers from hydrogen pattern-implanted wafers. J. Electron. Mater. 30, (Aug. 8, 2001), 960-964. DOI= http://dx.doi.org/10.1007/BF02657717.*

Yun et al., "Thermal and Mechanical Separations of Silicon Layers from Hydrogen Pattern-Implanted Wafers," *Journal of Electronic Materials*, vol. No. 36, No. 8, 20001, pp. 960-964.

Yun et al., "Fractional Implantation Area Effects on Patterned Ion-Cut Silicon Layer Transfer," Dept. of Electrical Eng. And Computer Sciences, University of California, Berkeley, CA 94720, USA, 1999 IEEE International SOI Conference, Oct. 1999, p. 129-30.

Agarwal et al "Efficient production of Silicon-on-insulator films by co-implatation of HE$^+$with H$^+$", *Applied Physics Letter, American Institute of Physics*, vol. 72, No. 9, Mar. 1998, pp. 1086-1088.

Bruel et al., [vol. 99-1] Meeting Abstract No. 333, "Single-crystal semiconductor layer delamination and transfer through hydrogen implantation," *The 195th Metting of The Electrochemical Society*, May 2-6, 1999, Seattle, Washington.

Camperi-Ginestet et al., "Alignable Epitaxial Liftoff of GaAs Materials with Selective Deposition Using Polyimide Diaphragms", *IEEE Transactions Photonics Technology Letters*, vol. 3, No. 12, Dec. 1991, pp. 1123-1126.

Cerofolini et al. "Ultradense Gas Bubbles in Hydrogen-or-Helium-Implanted (or Co-implanted) Silicon", *Materials Science and Engineering*, B71, 2000, pp. 196-202.

Demeester, et al., "Epitaxial Lift-off and its Applications", *Semicond. Sci. Technol.*, Vol. 8, 1993, pp. 1124-1135.

DiCioccio et al., "III-V layer transfer onto silicon and applications", *Phys. Stat. Sol. (a)*, vol. 202, No. 4., 2005, pp. 509-515/DOI 10.1002/pssa. 200460411.

Feijoo et al., "Prestressing of Bonded Wafers", vol. 92-7 1992 pp. 230-238.

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

Hamaguchi, et al., "Novel LSI/SOI Wafer Fabrication Using Device Layer Transfer Technique" *Proc. IEDM*, 1985, pp. 688-691.

Henttinen et al. "Mechanically induced Si Layer Transfer in Hydrogen-Implanted Si-Wafers", *American Institute of Physics*, vol. 76, No. 17, Apr. 2000, pp. 2370-2372.

Kucheyev et al., "Ion implantation into GaN", *Materials Science and Engineering*, 33, 2001, pp. 51-107.

Liu et al., "Ion implantation in GaN at liquid-nitrogen temperature: Structural characteristics and amorphization," *Physical Review B of The American Physical Society*, vol. 57, No. 4, 1988, pp. 2530-2535.

Moriceau et al., [vol. 99-1] Meeting Abstract No. 405, "A New Characterization Process Used to Qualify SOI Films," *The 195th Meeting of The Electrochemical Society*, May 2-6, 1999, Seattle, Washington.

Pollentier et al., "Fabrication of High-Radiance LEDs by Epitaxial Lift-off" *SPIE*, vol. 1361, 1990, pp. 1056-1062.

Suzuki et al., "High-Speed and Low Power $n^+$-$p^+$ Double-Gate SOI CMOS", *IEICE Trans. Electron.*, vol. E78-C, No. 4, Apr. 1995, pp. 360-367.

Timoshenko, S., "Analysis of Bi-Metal Thermostats", *J.Opt.Soc. Am.*, 11, 1925, pp. 233-256.

Tong et al, "Low Temperature SI Layer Splitting", *Proceedings 1997 IEEE International SOI Conference*, Oct. 1997, pp. 126-127.

Wong et al., "Integration of GaN Thin Films with Dissimilar Substrate Materials by Pd-In Metal Bonding and Laser Lift-off", *Journal of Electronic Materials*, vol. 28, No. 12, 1999, pp. 1409-1413.

\* cited by examiner

METHOD FOR MAKING THIN LAYERS CONTAINING MICROCOMPONENTS

PRIORITY APPLICATION

This application claims priority to French Patent Application No. 0113105 filed Oct. 11, 2001.

TECHNICAL FIELD

The invention relates to methods of producing microcomponents from a thin layer on a substrate and processing this thin layer/substrate combination.

The expression "thin layer" conventionally means a layer whose thickness is usually from a few tens of angstrom units to several micrometers. The substrate to which the invention relates can be an initial or intermediate substrate and can be "demountable", i.e. intended to be separated from this thin layer.

BACKGROUND

There is an increasing requirement to be able to produce microcomponents to be integrated onto supports other than those used to fabricate them.

Examples that may be cited are microcomponents on plastics material or flexible substrates. Here the term "microcomponent" means any wholly or partially processed electronic or optoelectronic device or any sensor (for example any chemical, mechanical, thermal, biological or biochemical sensor).

A layer transfer method can be used to integrate such microcomponents onto flexible supports.

There are many other examples of applications in which layer transfer techniques may be suitable for integrating microcomponents or layers onto a support that is unsuitable for their fabrication a priori. In the same line of thinking, these layer transfer techniques are also very useful when it is required to isolate a thin layer, with or without microcomponents, from its original substrate, for example by separating or eliminating the latter. Also in the same line of thinking, turning over a thin layer combined with transferring it onto another support provides engineers with a valuable degree of freedom to design structures that would otherwise be impossible. Thin films can be separated and turned over for example to produce buried structures such as buried capacitors for dynamic random access memories (DRAM) in which, unusually, the capacitors are first formed and then transferred onto another silicon substrate before fabricating the remainder of the circuits on this new substrate. Another example concerns the processing of dual gate transistor structures. The first gate of a CMOS transistor is produced on a substrate using a conventional technology and then transferred and turned over onto a second substrate to produce the second gate and finish the transistor; the first gate is therefore buried in the structure (see for example K. Suzuki, T. Tanaka, Y. Tosaka, H. Horie and T. Sugii, "High-Speed and Low-Power n+-p+ Double-Gate SOI CMOS", IEICE Trans. Electron., vol. E78-C, 1995, pages 360 to 367).

The requirement to isolate a thin layer from its original substrate is encountered in the field of light-emitting diodes (LED), for example, as reported in the following documents, for example: W. S. Wong et al., *Journal of Electronic Materials*, page 1409, vol. 28, No. 12, 1999, and 1. Pollentier et al., page 1056, SPIE vol. 1361, "Physical Concepts of Materials for Novel Optoelectronic Device Applications I", 1990. Here one of the aims is improved control of extraction of the light emitted. Another aim relates to the fact that in this particular example the sapphire substrate used for the epitaxial stack is bulky a posteriori, in particular because of its electrically insulative nature, and this prevents making electrical contact to its rear face. It therefore seems now to be desirable to be able to dispense with this sapphire substrate, the use of which was advantageous in the phase of growing the material.

An identical situation is encountered in the field of applications associated with telecommunications and microwaves, for example. In this case, it is preferable for the microcomponents to be finally integrated onto a support having a high resistivity, typically at least several kohm·cm. However, a highly resistive substrate is not necessarily available at the same cost and with the same quality as the standard substrates usually employed. In the case of silicon, for example, note the availability of 200 and 300 mm diameter silicon wafers of standard resistivity, whereas for resistivities in excess of 1 kohm·cm, what is available with a 200 mm diameter is highly unsuitable and there is nothing available at all with a 300 mm diameter. One solution is to process the microcomponents on standard substrates and then, during the final steps, to transfer a thin layer containing the microcomponents onto an insulative substrate such as glass, quartz or sapphire.

From a technical point of view, the major benefit of these transfer operations is that they decorrelate the properties of the layer in which the microcomponents are formed from those of the layer providing the final support, as a result of which these operations are beneficial in many other cases.

The cases may further be cited in which the substrate which is advantageous for processing the microcomponents is excessively costly. In the case of silicon carbide, for example, which offers the best performance (higher temperatures of use, significantly improved maximum powers and frequencies of use, and so on), but whose cost is very high compared to silicon, it would be beneficial to transfer a thin layer from the high-cost substrate (here silicon carbide) onto the low-cost substrate (here silicon) and recover the residue of the high-cost substrate for reuse, possibly after recycling. The transfer operation can take place before, during or after the processing of the microcomponents.

These techniques can also be beneficial in all fields in which obtaining a thin substrate is important for the final application. Power applications may be cited in particular, for reasons associated with the evacuation of heat (which improves as the thickness of the substrate is reduced), or because the electrical current must sometimes pass through the thickness of the substrates, incurring losses that, to a first approximation, are proportional to the thickness through which this current passes. Microchip card applications may also be cited, in which thin substrates are required for reasons of flexibility. Similarly, applications intended for processing 3D circuits and stacked structures may also be cited.

For all these applications (which are cited by way of example), circuit processing is carried out on thick or standard thickness substrates, with the advantages, firstly, of good mechanical resistance to the various technology steps and, secondly, of conforming to the standards relating to their processing on some kinds of production equipment. It is therefore necessary to carry out a thinning operation prior to the final application.

Various techniques can be used to transfer layers from one support to another support. The techniques described in 1985 by T. Hamaguchi et al., Proc. IEDM 1985, p. 688 may be cited, for example. Although these techniques are of great benefit because they transfer a layer from one substrate to another substrate, they necessarily consume the basic substrate (which is destroyed during the course of the process), and cannot transfer a thin film homogeneously unless a stop layer is present, i.e. a layer forming an inhomogeneity in the material of the substrate.

Of the prior art transfer methods that recover the thin film after transfer, it is also possible to use methods of transferring thin layers of materials containing (or not) all or part of a microcomponent. Some of these methods are based on creating a weak buried layer in a material by introducing one or more gaseous species. In this connection, see the following U.S., European, and French patents: U.S. Pat. No. 5,374,564, EP-A-533551, U.S. Pat. No. 6,020,252, EP-A-807970 FR-A-2767416, EP-A-1010198 FR-A-2748850, EP-A-902843 FR-A-2773261, EP-A-963598 which describe these methods. They are generally used with the objective of detaching the whole of a film from an original substrate in order to transfer it onto a support. The thin film obtained can then contain a portion of the original substrate. These films can be used as active layers for processing electronic or optical microcomponents.

In particular, these methods enable the substrate to be reused after separation, as only very little of these substrates is consumed during each cycle. The thickness removed is frequently only a few microns, while the substrates are typically several hundred microns thick. It is thus possible to obtain, in particular, in the method disclosed in U.S. Pat. No. 6,020,252, and European Patent No. EP-A-807970 substrates that are similar to substrates that are "demountable" (i.e. detachable substrates) with the aid of a mechanical stress. This particular method is based on implantation to form a buried weak area in which the cut is made during the final transfer.

Other methods, based on the lift-off principle, also separate a thin layer from the remainder of its original support, again without necessarily consuming the latter. These methods generally employ chemical etching to selectively etch an intermediate buried layer, possibly associated with mechanical forces. This type of method is widely used to transfer III-V elements onto different types of support (cf. C. Camperi et al., IEEE Transaction and Photonics Technology, vol. 3 No. 12, 1991, page 1123). As explained in a paper by P. Demeester et al., Semicond. Sci. Technol. 8, 1993, pages 1124 to 1135, the transfer, which generally takes place after an epitaxial step, can take place before or after processing the microcomponents (it is known as preprocessing or postprocessing, respectively).

Of the methods using a (pre-existing) buried layer that is mechanically weaker than the remainder of the substrate to obtain localized separation at this buried layer, the ELT-RAN® process may be cited (Japanese Patent Publication Number 07302889). In this case, a stack based on monocrystalline silicon is locally weakened by forming an area of porous silicon. Another similar case exploits the presence of a buried oxide in the case of a silicon on insulator (SOI) structure, however conventional the latter may be (i.e. even if processed without seeking to achieve any particular demountable effect). If this structure is stuck sufficiently strongly to another substrate and a high stress is applied to the structure, localized fracture can be obtained, preferentially in the oxide, leading to cutting at the scale of the entire substrate. An example of this is described in PHILIPS Journal of Research, Vol. 49 No. 1/2, 1995, pages 53 to 55. Unfortunately, this fracture is difficult to control and necessitates high mechanical stresses, which is not without risk of breaking the substrates or damaging the microcomponents.

The advantage of such weak buried layer methods is the ability to process layers based on crystalline materials (Si, SiC, InP, AsGa, $LiNbO_3$, $LiTaO_3$, etc.) in a range of thicknesses from a few tens of angstrom units (A) to several micrometers (µm), with very good homogeneity. Greater thicknesses are also accessible.

The techniques of transferring layers (with or without microcomponents) based on producing demountable substrates by forming an intermediate layer or weakened interface (whether the weakened interface is obtained by implanting species, forming a porous area, or any other means) run up against problems relating to unintentional delamination if processing prior to the intentional separation is too aggressive.

According to French Patent No. FR 2748851, a demountable substrate of the above kind can be produced by introducing a gaseous species (for example hydrogen). The implanted dose must be chosen so that thermal annealing does not induce any deformation or exfoliation of the surface. Depending on the mechanical forces that can be applied and/or the tool used to induce the separation between the surface layer and the remainder of the substrate, the weakening achieved in the implanted area may prove insufficient. It may then be beneficial to weaken further the implanted area.

The method described in French Patent No. FR 2773261 also produces a demountable substrate, thanks to the presence of a buried layer of inclusions used as a trapping layer in the substrate. After various treatments, for example processing of electronic microcomponents, this localizes, preferably in this trapping layer, sufficient quantities of gaseous species that can contribute to the final separation of the thin surface layer delimited by the area of inclusions and the surface of the substrate. This separation step can include heat treatment and/or the application of mechanical stress to the structure.

The use of this technique can encounter limitations, in particular with regard to the reintroduction of gaseous species into the surface layer after the fabrication of some or all of the microcomponents, which may be undesirable for processing some types of microcomponents.

In the method disclosed in French application No. 0006909, the introduction of a controlled dose of implanted species firstly weakens the buried area (or even overweakens it) and secondly evacuates the gas afterwards, in order to limit a pressure effect in the event of a rise in temperature. There is therefore no deformation or exfoliation of the surface during high-temperature technology steps. This technique necessitates rigorous control of the implantation conditions (dose, temperature, etc.). It may therefore prove beneficial to be able to relax the constraints relating to a narrow technology window.

French Patent No. FR 2758907 proposes local introduction of gaseous species after processing the microcomponents in the surface layer of the substrate. The introduction of these species leads to the formation of a discontinuous buried layer of microcavities that can contribute to the fracture after fastening the treated substrate to a support substrate. Thus the substrate is weakened after processing the various microcomponent fabrication technology steps. The accessible size of the areas to be masked (which correspond to the active areas of the microcomponents) may prove to be a limitation, depending on the intended applications. For example, this technique is difficult to use for microcomponent sizes from a few tens of microns to a few hundred microns. Moreover, depending on the microcomponent production technology used, the thickness of the active layer, i.e. the layer incorporating the microcomponents, can be as much as several microns. The introduction of gaseous species at a great depth (by dedicated implanters or by accelerators), with adequate protection of the areas by masking, can then prove difficult.

SUMMARY

An object of the invention is to combine reliably the imperative easy separation, at the required time, and the imperative ability, where necessary, to withstand the application of mechanical or heat treatments necessary for processing all or some electronic, optical or acoustical microcomponents or sensors, or to withstand epitaxial steps, without causing premature separation or delamination.

A more general object of the invention is to provide a combination of a thin layer on a substrate, this layer being connected to this substrate by an intermediate layer or an interface having an easily controlled mechanical strength.

To eliminate various drawbacks described above, the invention proposes a method for fabricating a thin layers containing microcomponents, said method being noteworthy in that it includes in particular the following steps for each layer:

a) providing a substrate b) implanting at least one gaseous species in the substrate in line with a plurality of implantation areas defined on a surface of the substrate, degrading of this surface of the substrate during the step c) being prevented by an appropriate choice of the implantation depth and the geometry of said implantation areas, c) fabricating microcomponents in the surface layer of the substrate delimited by the implantation depth, and d) separating the substrate into two parts, one part containing said surface layer containing said microcomponents and the other part containing the remainder of the substrate.

Here the term "degradation" means any surface deformation (for example in the form of blisters) or any exfoliation of the surface layer that could compromise the correct execution of the step c).

Thus, according to the invention, there are areas protected from implantation and areas subjected to the implantation of said gaseous species, the shapes, dimensions and distribution of these implantation areas being chosen to prevent any deformation of the surface of the substrate exceeding an amplitude of, say, a few tens of angstrom units, during the step of processing the microcomponents. Account is therefore taken, in particular, of the stiffness of the surface layer (which may consist of a stack of several layers of materials), the implantation conditions, and subsequent treatments up to separation of said thin layer.

The method according to the invention processes a demountable substrate including buried areas weakened by the presence of microcavities and/or microcracks (thus locally separating the surface layer from the remainder of the substrate), and areas that have not been weakened, or that have been only slightly weakened, so that the surface layer remains fastened to the substrate. Localized areas are obtained in this way in which the surface layer separates easily from the substrate because of the presence in these areas of these microcavities and/or microcracks.

An important advantage of the invention is that the lateral confinement of these buried weak areas prevents significant deformation of the surface layer in the form of blisters or exfoliation. The technology window for the implanted doses is widened compared to the prior art methods, because localized implantation in confined areas limits the lateral extension of microcracks.

Moreover, the surface of the substrate obtained is compatible with standard technology steps, such as lithography operations or the production of microcomponents. In particular, the weakened substrate obtained is compatible with high-temperature treatments, for example thermal oxidation or gas-phase or liquid-phase epitaxy.

After these varied technological steps have been processed, the presence of areas locally separating the surface layer from the substrate produces a deep fracture between this surface layer and the substrate.

Said implantation areas can conveniently be openings in a mask placed on the surface of the substrate.

Said gaseous species can comprise hydrogen ions, for example, or ions of at least one rare gas, or a mixture of such ions.

It will be noted that the fabrication method according to the invention can comprise, before step b), a supplementary step of introducing at least one gaseous species, this at least one supplementary introduction being effected with no mask on the surface of the substrate. Here, and hereinafter, the term "introduction" refers to conventional techniques such as ion implantation, for example, thermally activated diffusion or plasma diffusion. A substrate that has been treated by supplementary introduction before implantation in step b) is regarded as a substrate to which the method of the invention as succinctly described hereinabove is applied.

In accordance with preferred features, such supplementary introduction with no mask on the substrate can be processed between steps b) and c).

Thanks to these provisions, a buried area is obtained delimiting a surface layer that is more or less weakened, since some areas have undergone two implantations, for example, whereas other areas have undergone only one. The doses of ions introduced during these implantations can be such that their sum corresponds to an average dose which, in the case of implantation over the whole of the surface of the substrate, would cause the appearance of blisters after heat treatment. It must be remembered that the geometry of the areas that have undergone double implantation prevents the appearance of such blisters and therefore degradation of the surface of the substrate. This embodiment can in particular be favorable during the step of separating the surface layer from the remainder of the substrate (step d), and obtain such separation by less stressful treatments.

According to other preferred features, the fabrication method according to the invention comprises, before or during step c), a step during which the implanted area is overweakened, for example by appropriate heat treatment or by depositing particular thin layers inducing mechanical stresses. Here the term "overweakened" means a state of greater weakness of the implanted area, to reduce the stresses to be used at the time of final separation.

Thanks to this provision, the structural defects generated by implanting gaseous species increase in the implanted areas, which increases the weakness of these buried local areas. A high weakening threshold can be reached in these areas by judiciously choosing the dimensions of the implantation patterns, without this causing significant surface deformation or exfoliation.

It is to be noted that the optional steps of overweakening the implanted areas can be processed entirely or partly during microcomponent fabrication steps provided that the temperature and duration sequences are carefully chosen.

According to other preferred features, the fabrication method according to the invention comprises, between step c) and step d), a supplementary step of introducing at least one gaseous species. This supplementary introduction of at least one gaseous species can be effected with the aid of a mask defining implantation areas of this at least one gaseous species, for example.

Thanks to this provision, the buried area is weakened, with the aim of facilitating subsequent detachment of the surface layer from the substrate.

This detachment (step d)) can be effected by means of heat treatment and/or by applying mechanical stresses.

Another aspect of the invention concerns a thin layer containing microcomponents, said thin layer being noteworthy in that it is fabricated by any of the methods succinctly described hereinabove. If necessary, this layer is transferred to a support, which may be flexible or rigid.

Other aspects and advantages of the invention will become apparent on reading the following detailed description of particular embodiments provided by way of non-limiting example.

The principal steps of fabricating a layer conforming to one embodiment of the invention are described.

DETAILED DESCRIPTION

Figure 1A:
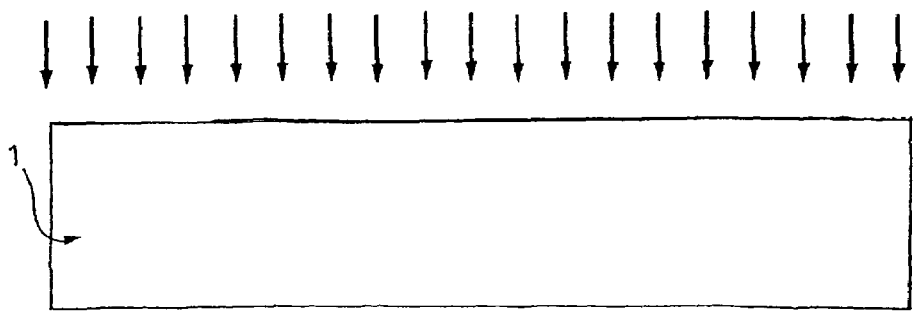
FIG. 1A is a diagrammatic view of a substrate undergoing ion implantation in accordance with an alternative embodiment of the invention.
Figure 1:
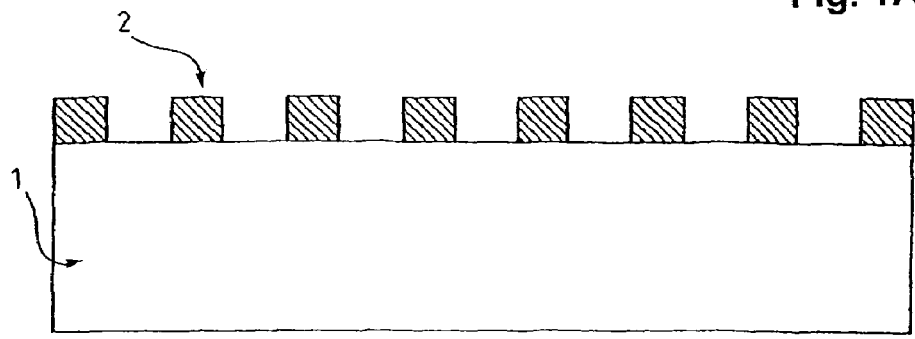
FIG. 1 is a diagrammatic view of a substrate provided with masking means.

FIG. 1 shows the initial preparation of a substrate 1. This preparation consists of defining the areas to be implanted by processing a mask 2 delimiting, on the surface of a substrate 1, non-masked areas (that are subsequently implanted) and masked areas (that are not implanted). As described above, the fabrication method according to the invention can comprise, before forming the mask 2, a supplementary step of introducing at least one gaseous species. As illustrated in FIG. 1A, this at least one supplementary introduction being effected with no mask on the surface of the substrate 1.

This mask can be produced by applying a layer of resin to the substrate 1 lithographically or by applying any other surface layer (for example a layer of oxide) to the substrate 1 by successive lithography and etching steps. The masking can equally well be affected by placing a grid on the surface of the substrate 1 during the implantation step. This masking grid can be at the level of a diaphragm disposed between the beam of ions to be implanted and the target substrate. The above masking means have been described by way of example, but other masking means may be suitable.

A judicious choice of the shapes and the dimensions of the masked areas is of primary importance for the correct processing of subsequent steps. The implantation step creates a discontinuous buried area including specific defects (platelets, microcavities and/or microbubbles) due to the introduction of the ions. The step of defining the areas to be implanted allows for the properties of the substrate, the properties of the different composition or material layer or layers on the surface of the substrate 1, and the implantation conditions.

The stiffness properties and the thickness of the surface layer to be produced determine the dimensions and the spacing of the areas to be implanted. The latter are established so that the growth of microcavities and microcracks in the implanted areas, such as could occur during heat treatment, for example, lead:

neither to a vertical relaxation of the surface layer, by formation of blisters, with an amplitude exceeding a few tens of angstrom units, nor to total or partial interaction between different locally implanted areas of such a kind as to cause lifting or exfoliation of all or part of the surface layer.

In this way it is possible to maintain the surface of the surface layer free of any significant degradation, with locally weakened buried areas.

Depending on the type of masking used (for example, oxide mask on the substrate, grid placed on the surface of the substrate during implantation, or grid placed on the path of the beam of ions during implantation), the effective lateral dimensions (in the plane of the surface of the substrate) of the buried areas that have been subjected to ion implantation depend on the Gaussian profiles of implanted ions. This means that a sharp edge of the mask on the surface is not rigorously reproduced in the implanted buried layer. Dispersion of the ions as they penetrate into the material induces a significant widening of the implanted area. It is therefore necessary to take account of this phenomenon in order to define the dimensions of the masked and non-masked areas correctly.

On the other hand, the dimensions of the implanted areas must be sufficient for easy separation of the surface layer at the end of the process.

Trials carried out by the inventors have shown that the total surface area of the implantation areas generally represents between approximately ⅓ and approximately ⅚ of the surface area of the substrate 1. Moreover, a linear dimension of the implantation areas is preferably from approximately 0.1 times to approximately 10 times the target thickness for the surface layer in the case of a silicon substrate. In the case of a more rigid material, this dimension can be significantly greater, for example of the order of 50 times.

For example, an implantation mask can be used incorporating 10 μm×10 μm for example square openings separated by for example 5 μm masked areas. Another example of an implantation mask has non-masked areas in the form of lines whose dimensions are for example 5 μm×100 μm, the lines being spaced from each other by for example 5 μm.

Figure 2:
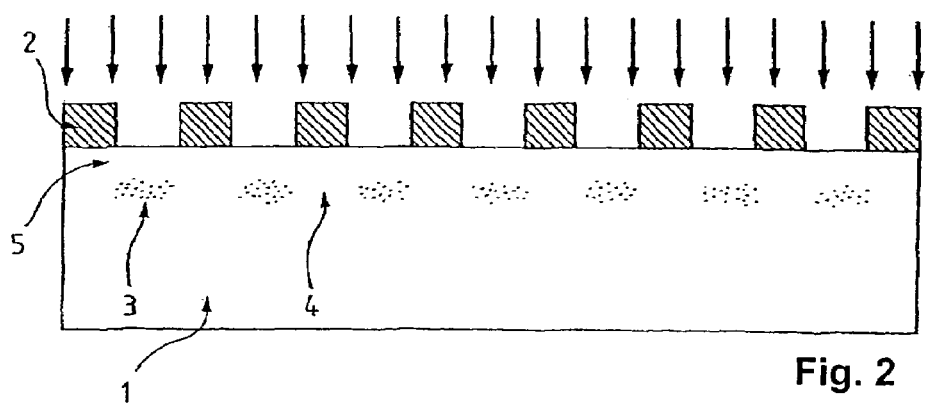
FIG. 2 shows the first step of a method of fabricating layers according to the invention.

The first step of this embodiment, shown in FIG. 2, therefore consists of introducing at least one gaseous species such as hydrogen and/or a rare gas in ionic form into the substrate 1.

The substrate 1 consequently has a set of buried areas 3 that have been subjected to implantation of gaseous species, these areas 3 being separated from each other by areas 4 in which the original masking has prevented the introduction of gaseous species. Thus the substrate 1 comprises a discontinuous buried layer made up of defects 3 such as platelets, microcavities, microbubbles or microcracks. The lateral confinement of the microcracks 3 prevents their expansion or relaxation degrading the surface of the substrate 1.

The implantation energy of the gaseous species controls the thickness of the surface layer 5 delimited by the implanted layer and the surface of the substrate 1.

One application example is implanting hydrogen ions at an energy from 150 to 250 keV and at a dose from approximately $10^{16}$ to approximately $10^{17}$ H$^+$/cm$^2$.

Figure 3:
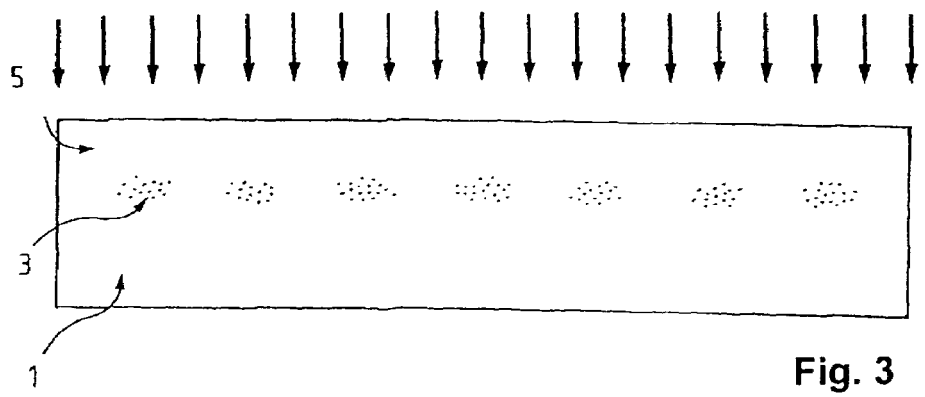
FIG. 3 is a diagrammatic view of the substrate after removing the mask according to the invention.

The mask is then removed, leaving the surface of the substrate 1 entirely bare, as shown in FIG. 3.

In a variant of the method according to the invention, this is followed by a second implantation of ions of the same species or of different species from the first implantation (as depicted by the arrows in FIG. 3): the openings in the original mask are therefore subjected to a second implantation, while the initially masked areas are submitted to a first implantation. This second implantation increases the density and/or the size of the defects in the previously implanted areas and induces the formation of buried defects in the initially masked areas. The dose introduced during the second implantation is preferably relatively low, i.e. it must not form blisters or cause exfoliation after annealing at a moderate temperature (from approximately 450° C. to approximately 600° C.). It is preferably carried out at an energy of 180 keV and at a dose of $4 \times 10^{16}$ H$^+$/cm$^2$, for example.

There is then, at depth, a buried area comprising a greater or lesser quantity of gaseous species and therefore a greater or lesser density of microcavity defects. The areas that were submitted only to the second implantation are therefore less weakened than the doubly implanted areas, but establish the continuity of the buried weak area.

The development of the weak areas 3 created by one or more implantations of gaseous species, as described hereinabove, depends on the implantation conditions and on any treatment effected after implantation. These optional treatments aim to overweaken the local implanted areas 3 and to induce the growth of microcavities in these areas. To this end, heat treatment at a temperature of the order of 450 to 475° C. may be applied for a few minutes, for example.

Figure 4:
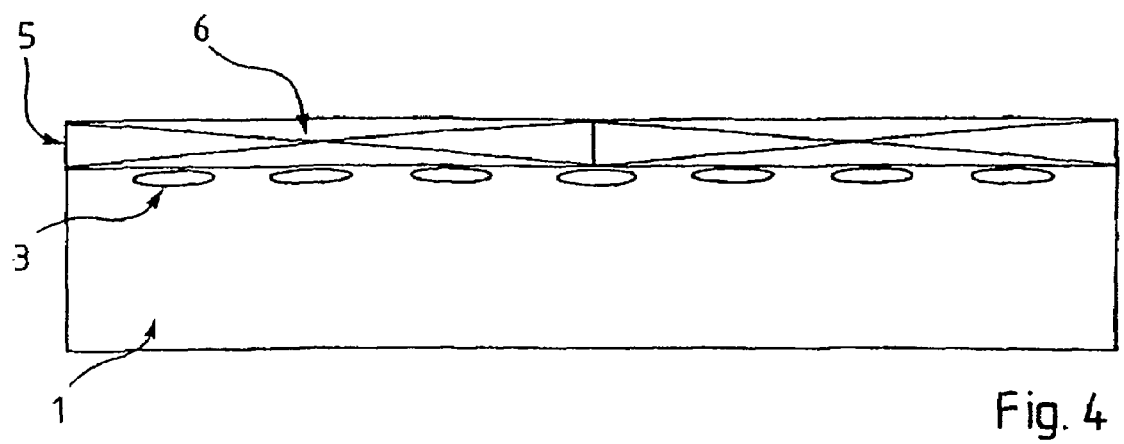
FIG. 4 is a diagrammatic view of the substrate after a second step of a method of fabricating layers according to the invention.

During a second step of this embodiment of the invention, shown in FIG. 4, the substrate weakened in this way can then be subjected to heat treatment, deposition or epitaxy steps, or other treatment for producing electronic and/or optical microcomponents and/or sensors 6, without risk of degrading the surface.

Thus, if necessary, the substrate can be subjected to epitaxy operations. A 5 μm epitaxial layer can be used to produce CMOS-type microcomponents using conventional techniques, for example. A 50 μm epitaxial layer can be used to produce photovoltaic cells, for example.

The third and final step of this embodiment of the invention consists of separating the surface layer 5 containing the microcomponents 6 from the remainder of the substrate 1. Depending on the conditions under which the first two steps are carried out, this separation can be carried out either by means of heat treatment, by judicious application of mechanical stresses to the structure, or by a combination of heat treatment and mechanical stresses.

In a variant of the invention, before proceeding to this separation, supplementary local introduction of at least one gaseous species in areas identical to or different from the implantation areas used for the first step of this embodiment can be effected with the aim of facilitating subsequent separation of the surface layer from the substrate.

This addition of gaseous species can be effected by implantation in the areas already weakened or constitute a continuous weakened buried area by implantation in initially masked areas underneath which the substrate is not weakened much or at all. The implantation energy is then chosen so that the implanted species reach the depth of the areas weakened by the initial implantation steps, allowing for changes of thickness occurring during the production of the microcomponents on the layer 5.

A moderate dose of the order of $6 \times 10^{16}$ H$^+$ ions/cm$^2$ is preferably implanted whereby separation is obtained for a heat treatment at a temperature from 400 to 500° C.

It is important to note that the conditions for using this variant depend on:
  the size of the microcomponents (it may be necessary to prevent the implanted ions crossing active areas of the microcomponents), and/or
  the sensitivity of the microcomponents to ion implantation, regardless of their size, if the microcomponents are not degraded by having ions pass through them or at least some parts of the microcomponents are not sensitive to the ions.

In particular, to process this supplementary implantation, appropriate masking can be used, different, of course, from the masking used in the first step of this embodiment.

The step of separating the surface layer 5 containing the microcomponents 6 from the remainder of the substrate 1 can include heat treatment (furnace and/or local heating and/or laser beam, etc.) and/or the application of mechanical stresses such as a sprayed jet of fluid (gas, liquid) and/or the insertion of a blade in the weakened area and/or applying traction, shear or bending stresses to the substrate 1. For example, heat treatment at approximately 450° C. can be applied for 30 minutes to separate the surface layer from the initial substrate.

This separation can yield a self-supporting layer or the surface layer 5 can be transferred onto a support substrate 7, for example using the molecular adhesion technique or adhesive substances. This support 7 stiffens the layer 5 transferred from the weakened substrate, in particular for transportation and/or finishing steps.

Figure 5:
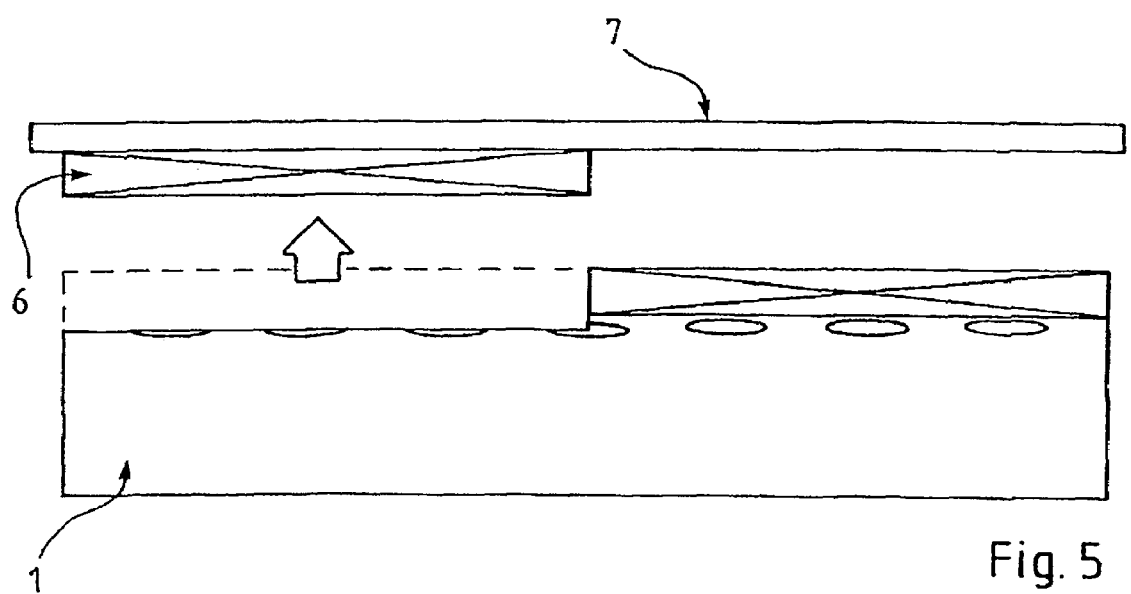
FIG. 5 shows the individual transfer of a microcomponent to a support substrate.

Moreover, as shown in FIG. 5, the demountable substrate can be prepared beforehand so that each microcomponent 6 can be taken off individually. This technique is disclosed in French Patent No. FR 2781925.

Figure 6:
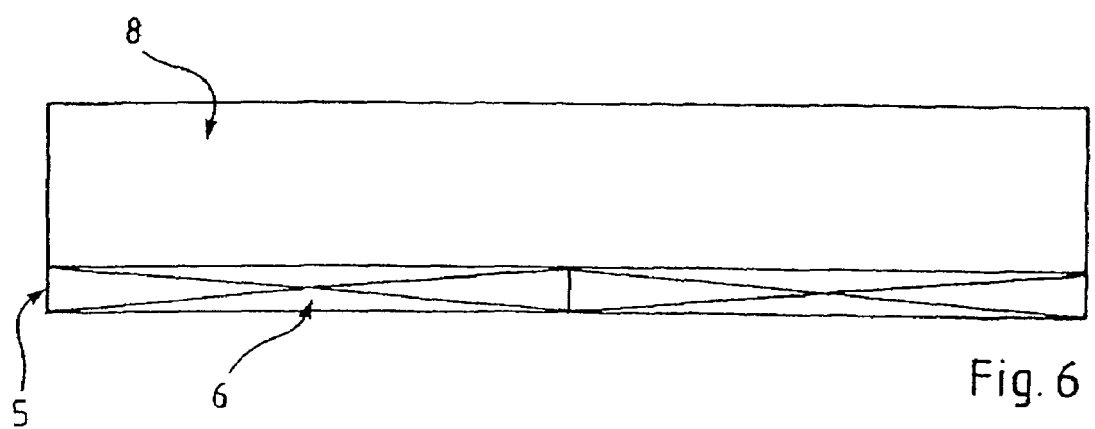
FIG. 6 shows the transfer to a "handle" support of a layer according to the invention containing microcomponents.
Figure 7:
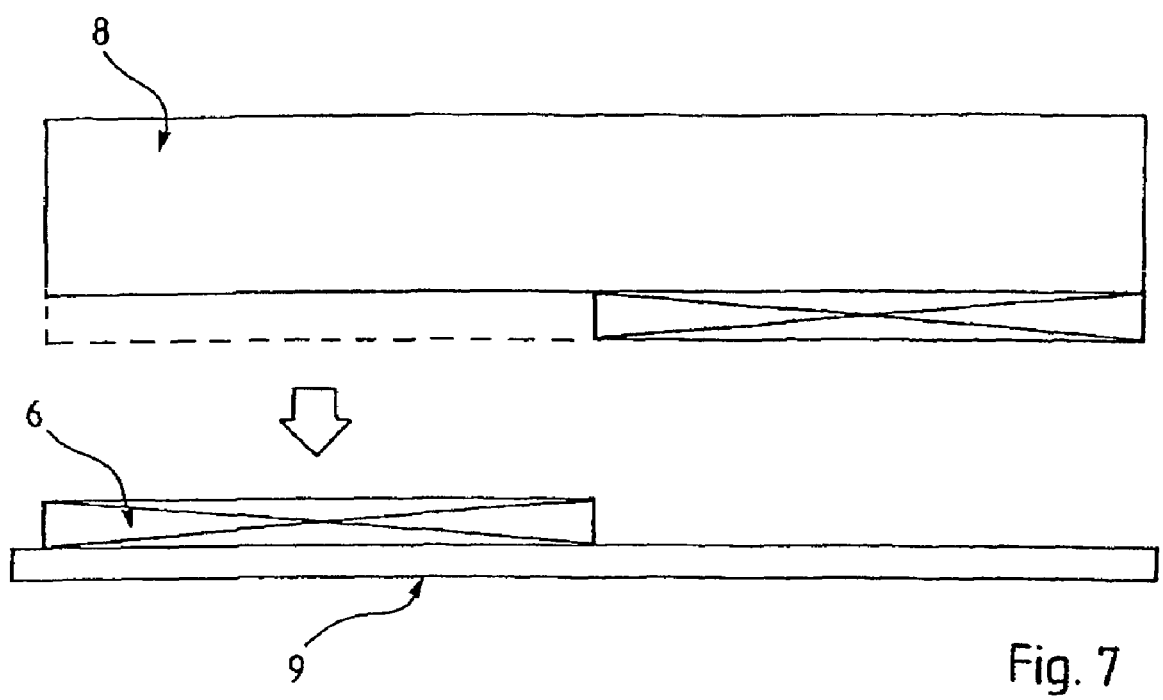
FIG. 7 shows the individual transfer of a microcomponent to a final support from a "handle" support.

A variant of the transfer step to the final support can comprise an intermediate step of transferring the surface layer 5 from the weakened substrate onto a "handle" support 8, as shown in FIG. 6. The microcomponents 6 can then be selectively or non-selectively transferred to a final support 9, as shown in FIG. 7.

The final support 7 or 9 can be of silicon, plastics material, or glass, for example, and can be flexible or rigid.

After separating and transferring the surface layer 5, the remainder of the weakened substrate can be recycled either as an initial substrate or, possibly, as a support.

The invention claimed is:

1. A method for fabricating thin layers containing microcomponents, the method comprising:
  a) providing a substrate substantially unpopulated by microcomponents;
  b) implanting at least one gaseous species in the substrate to form a plurality of linear gaseous implantation areas defined on a surface of the substrate, so as to create a plurality of buried weak areas near a gaseous implantation depth;
  c) fabricating microcomponents in a surface layer of the substrate delimited by the buried weak areas, wherein at least one of the microcomponents is fabricated at least partially in an area corresponding to a zone that was not implanted during step b), and wherein the implantation depth and the geometry of the gaseous implantation areas prevents the surface of the substrate from being degraded during fabricating the microcomponents; and d) detaching the surface layer from the remainder of the substrate and in the absence of further implantation steps between step c) and step d), wherein a sum of implantation doses corresponds to an average implantation dose that exceeds a dose necessary for defoliation of the surface layer.

2. A method for fabricating thin layers containing microcomponents, the method comprising:
   a) providing a substrate substantially unpopulated by microcomponents;
   b) implanting at least one gaseous species in the substrate to form a plurality of linear gaseous implantation areas defined on a surface of the substrate, so as to create a plurality of buried weak areas including microcavities or microcracks near a gaseous implantation depth;
   c) fabricating microcomponents in a surface layer of the substrate delimited by the buried weak areas, wherein at least one of the microcomponents is fabricated at least partially in an area corresponding to a zone that was not implanted during step b), and wherein the implantation depth and the geometry of the gaseous implantation areas prevents the surface of the substrate from being degraded during fabricating the microcomponents; and
   d) splitting the surface layer from the remainder of the substrate at or in proximity to the buried weak areas and in the absence of further implantation steps between step c) and step d).

3. A method for fabricating thin layers according to claim 2 further comprising:
   introducing at least one supplemental gaseous species, in the absence of a mask on the surface of the substrate, before step b), or between step b) and step c), or before step b) and between steps b) and c).

4. A fabrication method according to claim 3, wherein at least a portion of the microcomponents are processed at the same time in line with areas that were implanted and in line with areas that were not implanted during step b).

5. A fabrication method according to claim 3, wherein said implantation areas are defined by a mask placed on the surface of the substrate.

6. A fabrication method according to claim 3, wherein the total surface area of the implantation areas comprises approximately ⅓ to approximately ⅚ of the surface area of the substrate.

7. A fabrication method according to claim 3, wherein a linear dimension of the implantation areas is approximately 0.1 times to approximately 50 times a thickness of the surface layer.

8. A fabrication method according to claim 3,
   a) providing a substrate substantially unpopulated by microcomponents;
   b) implanting at least one gaseous species in the substrate to form a plurality of linear gaseous implantation areas defined on a surface of the substrate, so as to create a plurality of buried weak areas near a gaseous implantation depth and before or during step b), over weakening the implanted area;
   c) fabricating microcomponents in a surface layer of the substrate delimited by the buried weak areas, wherein at least one of the microcomponents is fabricated at least partially in an area corresponding to a zone that was not implanted during step b), and wherein the implantation depth and the geometry of the gaseous implantation areas prevents the surface of the substrate from being degraded during fabricating the microcomponents;
   d) introducing at least one gaseous species, in the absence of a mask on the surface of the substrate, before step b), or between step b) and step c), or before step b) and between steps b) and c); and
   e) detaching the surface layer from the remainder of the substrate in the absence of further implantation steps between step c) and step d).

9. A fabrication method according to claim 5, wherein introducing at least one gaseous species comprises using the mask to define implantation areas of the at least one gaseous species.

10. A fabrication method according to claim 2, wherein step d) further comprises applying a heat treatment or mechanical stresses, or a combination thereof.

11. A fabrication method according to claim 10, wherein applying mechanical stresses comprises the use of a fluid jet, or the insertion of a blade in the implanted area or applying traction, shear or bending stresses to the substrate, or a combination thereof.

12. A fabrication method according to claim 10, wherein the heat treatment comprises heating in a furnace or local heating or heating with a laser or a combination thereof.

13. A fabrication method according to claim 2, further comprising applying a surface to the substrate before or during step d) to serve as a support for the surface layer after it is separated from the substrate.

14. A fabrication method according to claim 2, further comprising applying a handle support to the substrate before or during step d), and wherein the microcomponents are either selectively or non-selectively transferred to a final support.

15. A thin layer containing microcomponents fabricated by means of a method according to claim 2.

16. A thin layer according to claim 15, wherein the thin layer is transferred onto either a flexible or a rigid support.

17. A method for fabricating thin layers containing microcomponents, the method comprising:
   a) providing a substrate substantially unpopulated by microcomponents;
   b) implanting at least one gaseous species in the substrate to form a plurality of linear gaseous implantation areas defined on a surface of the substrate, so as to create a plurality of buried weak areas near a gaseous implantation depth;
   c) fabricating microcomponents in a surface layer of the substrate delimited by the buried weak areas, wherein at least one of the microcomponents is fabricated at least partially in an area corresponding to a zone that was not implanted during step b), and wherein the implantation depth and the geometry of the gaseous implantation areas prevents the surface of the substrate from being degraded during fabricating the microcomponents;
   d) introducing at least one supplemental gaseous species, in the absence of a mask on the surface of the substrate, before step b), or between step b) and step c), or before step b) and between steps b) and c),
   wherein the at least one gaseous species or the at least one supplemental gaseous species comprise hydrogen ions or ions of at least one rare gas, or a mixture thereof; and
   e) detaching the surface layer from the remainder of the substrate in the absence of further implantation steps between step c) and step d).

* * * * *